(12) United States Patent
Makino

(10) Patent No.: US 7,496,872 B2
(45) Date of Patent: Feb. 24, 2009

(54) LIBRARY CREATING DEVICE AND INTERCONNECT CAPACITANCE ESTIMATION SYSTEM USING THE SAME

(75) Inventor: Osamu Makino, Kanagawa (JP)

(73) Assignee: NEC Corporation, Tokyo (JP)

( * ) Notice: Subject to any disclaimer, the term of this patent is extended or adjusted under 35 U.S.C. 154(b) by 291 days.

(21) Appl. No.: 11/473,245

(22) Filed: Jun. 23, 2006

(65) Prior Publication Data

US 2006/0294480 A1 Dec. 28, 2006

(30) Foreign Application Priority Data

Jun. 24, 2005 (JP) ............................. 2005-184982

(51) Int. Cl.
*G06F 17/50* (2006.01)
(52) U.S. Cl. ...................... 716/4; 716/1; 716/5; 716/18
(58) Field of Classification Search ............... 716/1–14, 716/18
See application file for complete search history.

(56) References Cited

U.S. PATENT DOCUMENTS 6,378,116 B1 * 4/2002 Ginetti .......................... 716/7
6,405,345 B1 * 6/2002 Ginetti .......................... 716/2
6,622,291 B1 * 9/2003 Ginetti .......................... 716/9

FOREIGN PATENT DOCUMENTS

JP 9-134380 5/1997

* cited by examiner

*Primary Examiner*—Sun J Lin
(74) *Attorney, Agent, or Firm*—Foley & Lardner LLP

(57) ABSTRACT

An interconnect capacitance estimation system includes a first storage device, a library creating device and an interconnect capacitance estimating device. The first storage device stores layout data. The library creating device creates a library used for estimating a capacitance of a net in a semiconductor circuit based on the layout data. The interconnect capacitance estimating device estimates a capacitance of a target net in a target semiconductor circuit based on design data and the library. The library creating device calculates a logic cone size of a logic cone which is a combined circuit composing a signal path through which a signal from an input stage passes to an output stage, creates the library which relates a capacitance, the logic cone size and a fan-out. The interconnect capacitance estimating device calculates a logic cone size of a logic cone of the target net based on the design data, and estimates a capacitance of the target net based on the logic cone size of the target net and the table.

17 Claims, 12 Drawing Sheets

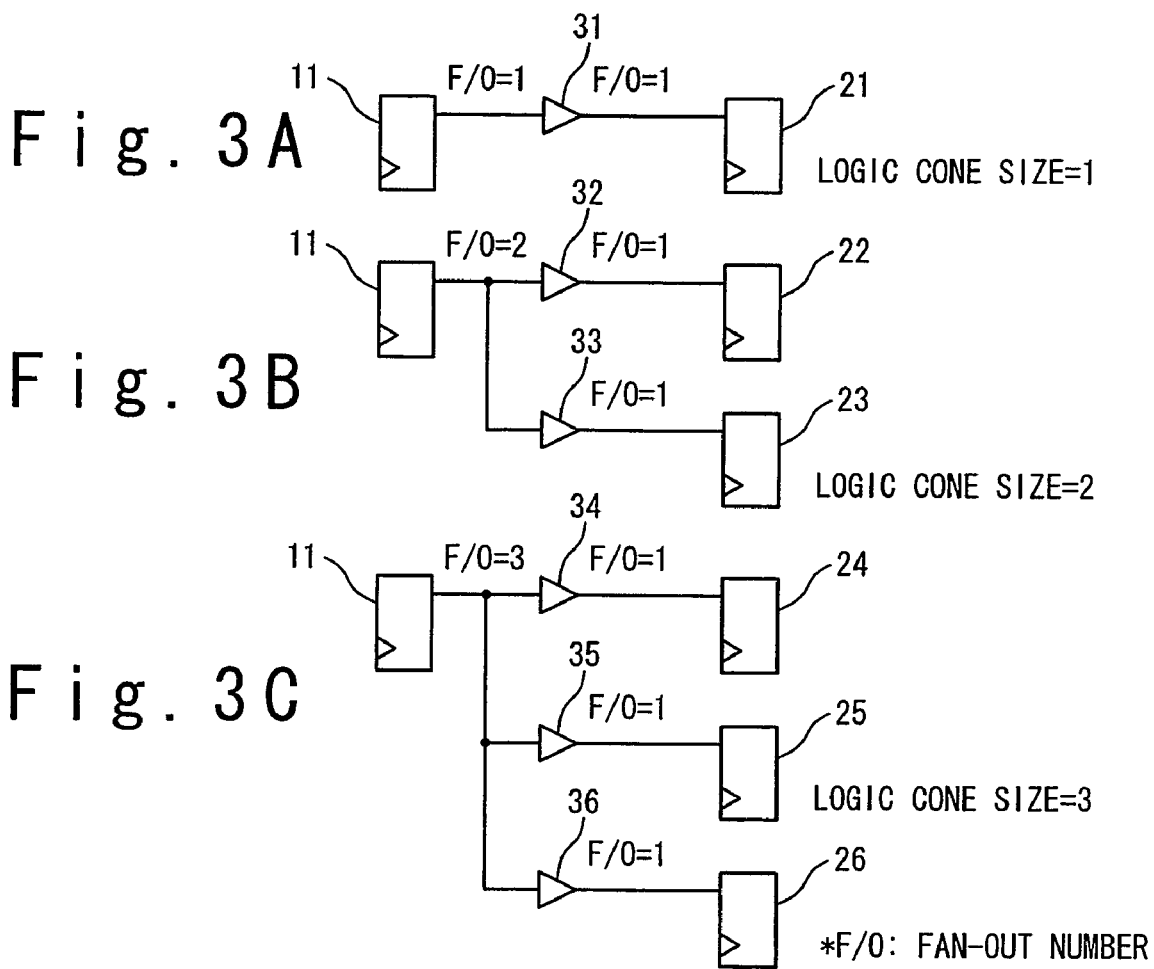

Fig. 9

| NET NAME | F/O | CAPACITANCE OF NET (pF) |
|---|---|---|
| Net-a | 2 | 0.2 |
| Net-b | 1 | 0.1 |
| Net-c | 1 | 0.1 |
| Net-d | 1 | 0.1 |
| Net-e | 1 | 0.1 |
| Net-f | 2 | 0.5 |
| Net-g | 2 | 0.4 |
| Net-h | 2 | 0.3 |
| Net-i | 1 | 0.2 |
| Net-j | 1 | 0.2 |
| Net-k | 1 | 0.2 |
| Net-l | 1 | 0.2 |

Fig. 10

| LOGIC CONE SIZE | F/O | CAPACITANCE OF NET (pF) |
|---|---|---|
| 4 | 2 | 0.2 |
| 4 | 1 | 0.1 |
| 4 | 1 | 0.1 |
| 4 | 1 | 0.1 |
| 4 | 1 | 0.1 |
| 6 | 2 | 0.5 |
| 6 | 2 | 0.4 |
| 6 | 2 | 0.3 |
| 6 | 1 | 0.2 |
| 6 | 1 | 0.2 |
| 6 | 1 | 0.2 |
| 6 | 1 | 0.2 |

Fig. 11

| LOGIC CONE SIZE | F/O | CAPACITANCE OF NET (pF) |
|---|---|---|
| 4 | 2 | 0.2 |
| 4 | 1 | 0.1 |
| 6 | 2 | 0.4 |
| 6 | 1 | 0.2 |

LIBRARY CREATING DEVICE AND INTERCONNECT CAPACITANCE ESTIMATION SYSTEM USING THE SAME

BACKGROUND OF THE INVENTION

1. Field of the Invention

The present invention relates to the design of a semiconductor circuit, and more specifically to a technology of creating a library used for estimating an interconnect capacitance of a circuit laid out.

2. Description of the Related Art

In recent semiconductor design, miniaturization of semiconductors, and increases in scale and speed of LSIs have been greatly improved. Conventionally (before 0.5 µm process), the circuit performance is limited by gate-specific element delay, so-called gate delay. However, Since 0.35 µm process, the circuit performance is largely influenced by interconnection delay. Thus, with a conventional method designing the logical design and the layout design separately, there may be a case where a difference arises between delay estimated at the logical design stage and delay actually measured after the layout.

As a method of estimating circuit delay at the logical design stage, a method is known which uses a tentative wire load model stored in a logical synthesis library. When the circuit delay is estimated, the tentative wire load model is read by a logical synthesis tool that executes logical synthesis. The performance of a circuit generated by logical synthesis is influenced by the accuracy of a tentative wire load model thereof. To create the tentative wire load model, statistical distribution of interconnect loads extracted from past layout results is approximated by standard deviation or the like and then it is formed into a library for each fan-out number. In the conventional logical synthesis technology, the logical synthesis tool obtains the circuit area at the initial stage of the logical synthesis, searches a logical synthesis library for a tentative wire load model (table) that matches an area condition, and obtains the interconnection (wire) load based on the fan-out number of a net (a circuit which has been laid out).

However, on an actual semiconductor integrated circuit, a plurality of nets with the same fan-out number may exist in the same placement region. In this case, even though the nets have the same fan-out number, an interconnection length of one net may be different from that of another net, because of the placements of microcells included in the respective nets. For some of the nets having a large difference between the actual interconnection length and the tentative interconnection length at the logical design stage, the accuracy in the estimation of the tentative interconnection length deteriorates.

To solve the above-described problem, Japanese Laid-Open Patent Application JP-A-Heisei, 09-134380 (1997) discloses a tentative interconnection length estimation device. The tentative interconnection length estimation device executes estimation of the tentative interconnection length in consideration of information on connection of a net targeted for estimation. This tentative interconnection length estimation device includes fan-out number reading means, target microcell pin quantity reading and determination means, target microcell net quantity reading and determination means. The fan-out number reading means is for reading information related to the fan-out number of a net targeted for estimation. The target microcell pin quantity reading and determination means is for reading information related to the pin quantity of a target microcell to be connected to a net targeted for estimation. The target microcell net quantity reading and determination means is for reading information related to the quantity of nets connected to any of the target microcells.

According to this tentative interconnection length estimation device described in JP-A-Heisei, 09-134380, the tentative interconnection length is calculated by judging whether or not it is difficult to place a first and a second target microcells adjacently to each other, and then providing different calculation methods correspondingly to the case where it is difficult to place the first and second target microcells adjacently to each other and the case where it is easy to place the first and second target microcells adjacently to each other. Therefore, estimation of the tentative interconnection length is so executed as to reduce a difference between the tentative interconnection length and the actual interconnection length of a net located between microcells that can easily be placed adjacently to each other, and a difference between the tentative interconnection length and the actual interconnection length of a net located between microcells that cannot easily be placed adjacently to each other.

However, this tentative interconnection length estimation device executes the estimation of the tentative interconnection length without considering connection relationship of each net with those located before and after thereof. When each net is connected to a large number of cells located before and after thereof, the net tends to have a long interconnection length and the interconnect capacitance thereof tends to increase. On the contrary, when each net is connected to a small number of cells located before and after thereof, the net tends to have a short interconnection length and the interconnect capacitance thereof tends to decrease.

When considering interconnection delay attributable to both the interconnection resistance and the interconnect capacitance, it is required to analyze the capacitance of a net based on the interconnection length considering whether or not cells are placed in a spreading manner or placed densely. In another word, there is a demand of a technique for analyzing the capacitance of a net in a logical circuit considering connection relationship of each net with those located before and after thereof.

SUMMARY OF THE INVENTION

In order to achieve an aspect of the present invention, the present invention provides an interconnect capacitance estimation system including: a first storage device configured to store layout data; a library creating device configured to read the layout data, create a library including a table used for estimating a capacitance of a net in a semiconductor circuit based on the read layout data, and store the library into a second storage device; and an interconnect capacitance estimating device configured to estimate a capacitance of a target net in a target semiconductor circuit based on design data of the target semiconductor circuit and the table in the library, wherein the library creating device calculates a logic cone size of a logic cone which is a combined circuit composing a signal path through which a signal from an input stage of the net passes to an output stage of the net, creates the table which relates a capacitance of the net, the logic cone size and a fan-out of the net, and stores the table into the library, and the interconnect capacitance estimating device calculates a logic cone size of a logic cone of the target net based on the design data, and estimates a capacitance of the target net based on the logic cone size of the target net and the table.

In the present invention, the system creates the table used for estimating (analyzing) the capacitance in consideration of the logic cone (connection relations among interconnections based on the layout data). When actually analyzing the capacitance, after obtaining the logic cone of the target circuit based on the design data, the analysis of the capacitance is executed based on the logic cone and the fan-out. Therefore, the capacitance can be obtained, while estimating the densely or thinly placement of the logic gates before executing layout of the circuit.

BRIEF DESCRIPTION OF THE DRAWINGS

The above and other objects, advantages and features of the present invention will be more apparent from the following description taken in conjunction with the accompanying drawings, in which:

FIGS. 3A to 3C are circuit diagrams showing circuit configurations of different logic cone sizes and fan-out numbers according to the present invention;

FIG. 9 is a table showing an example of layout data according to the present invention;

FIG. 10 is a table showing an example of execution results of a capacitance extracting program according to the present invention; and FIG. 11 is a table showing an example of a capacitance table according to the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of an interconnect capacitance estimation system and a method of estimating an interconnect capacitance according to the present invention will be described below with reference to the attached drawings.

Figure 1A:
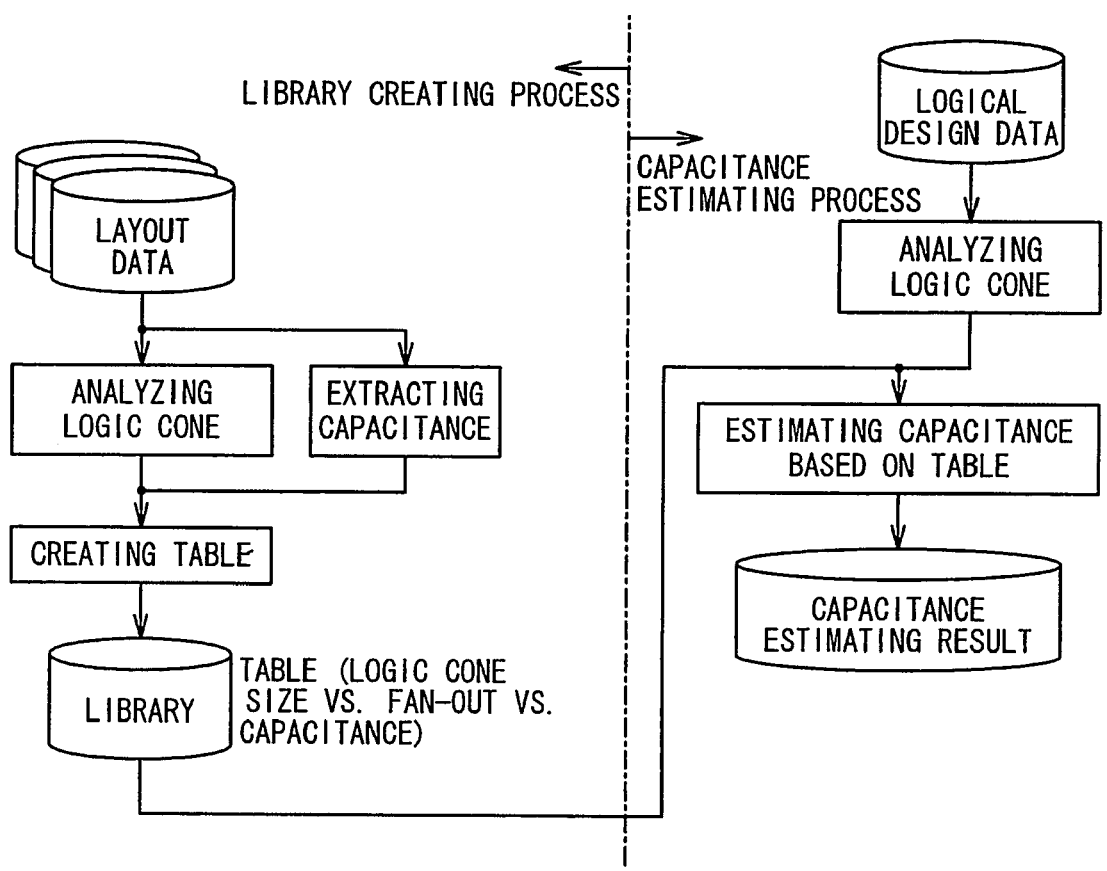
FIG. 1A is a block diagram showing an outline of a method of estimating an interconnection capacitance according to the present invention.
Figure 1B:
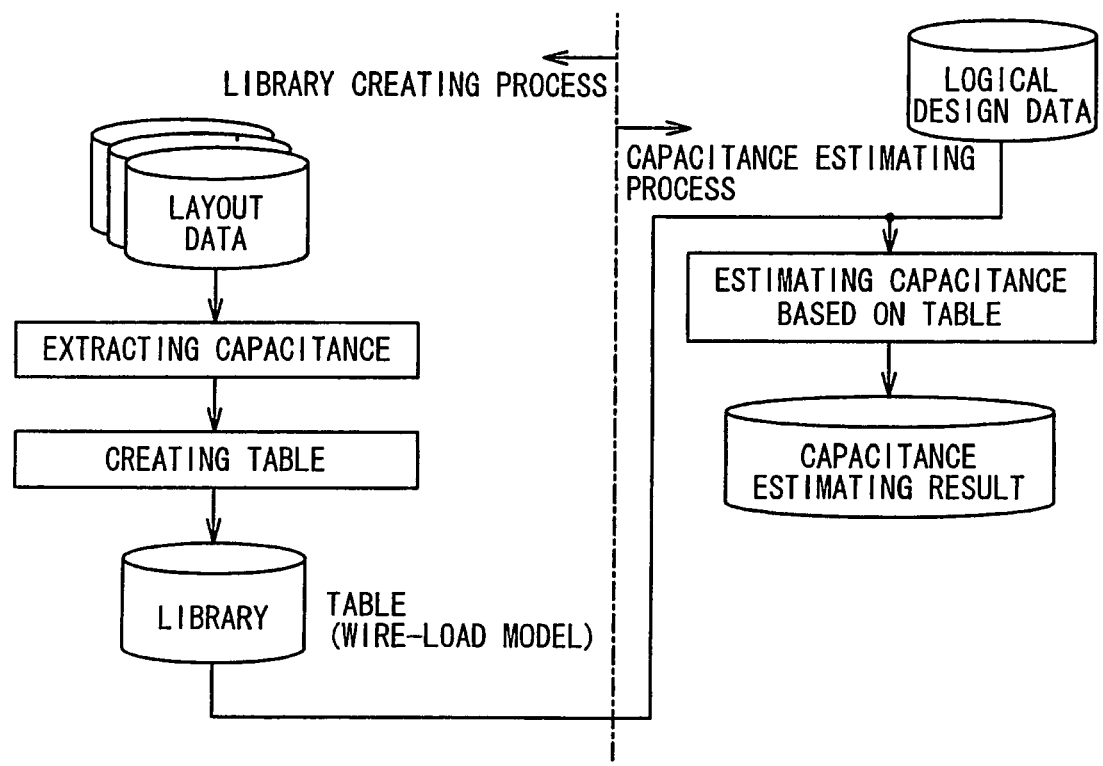
FIG. 1B is a block diagram showing an outline of a method of estimating an interconnection capacitance according to the conventional technique.

FIG. 1A is a block diagram showing an outline of a method of estimating the. interconnect capacitance according to the present embodiment. FIG. 1B is a block diagram showing an outline of a conventional method of estimating the interconnection capacitance, which is provided for reference. Referring to FIG. 1A, the method of estimating the interconnect capacitance of the present invention is divided into a library creating process and a capacitance estimating process. The library creating process is for creating a library for capacitance estimation. The capacitance estimating process is for analyzing the capacitance (interconnect capacitance) of a net (circuit which has been laid out) by referring to a table stored in the created library.

In the present embodiment, in the library creating process, a logic cone analysis and a capacitance extraction process are performed. The logic cone analysis specifies a circuit as a unit of a logic cone based on existing layout data. The capacitance extraction process extracts the capacitance of a net based on the layout data. The logic cone here will be described in detail later. In addition, the capacitance extraction process creates a net list based on the layout data, and then calculates the interconnect capacitance at the logical synthesis stage based on the net list.

Subsequently, the fan-out number of the net based on the layout data is calculated, a table (hereinafter, called a capacitance table) for analyzing the capacitance of the net in consideration of the size of the logic cone is created, and then a library is configured.

In the present embodiment, to estimate the capacitance of the net, it is analyzed what logic cone a circuit targeted for estimation includes based on logical design data. Subsequently, the capacitance table is read from the library and, the capacitance of the net is estimated considering the size of the logic cone.

Here, for comparison, a description will be given concerning a conventional method of capacitance analysis. Referring to FIG. 1B, in order to analyze a capacitance of a net, a table (wire load model) is conventionally created which analyzes the capacitance of the net by using the circuit size and the fan-out number of the net. To analyze the capacitance of the net, the capacitance of the net is estimated by using the size of a circuit targeted for estimation and the fan-out number of the net.

In the present embodiment, a capacitance table used for analyzing a capacitance is so configured as to be able to analyze the capacitance of a net based on a size of a logic cone. Therefore, this consequently draws the capacitance of the net based on the interconnection length corresponding to the density level when cells are actually placed, which allows analysis of the capacitance based on a logical circuit having interconnections closer to actual interconnections than those achieved by the conventional method.

Figure 2A:
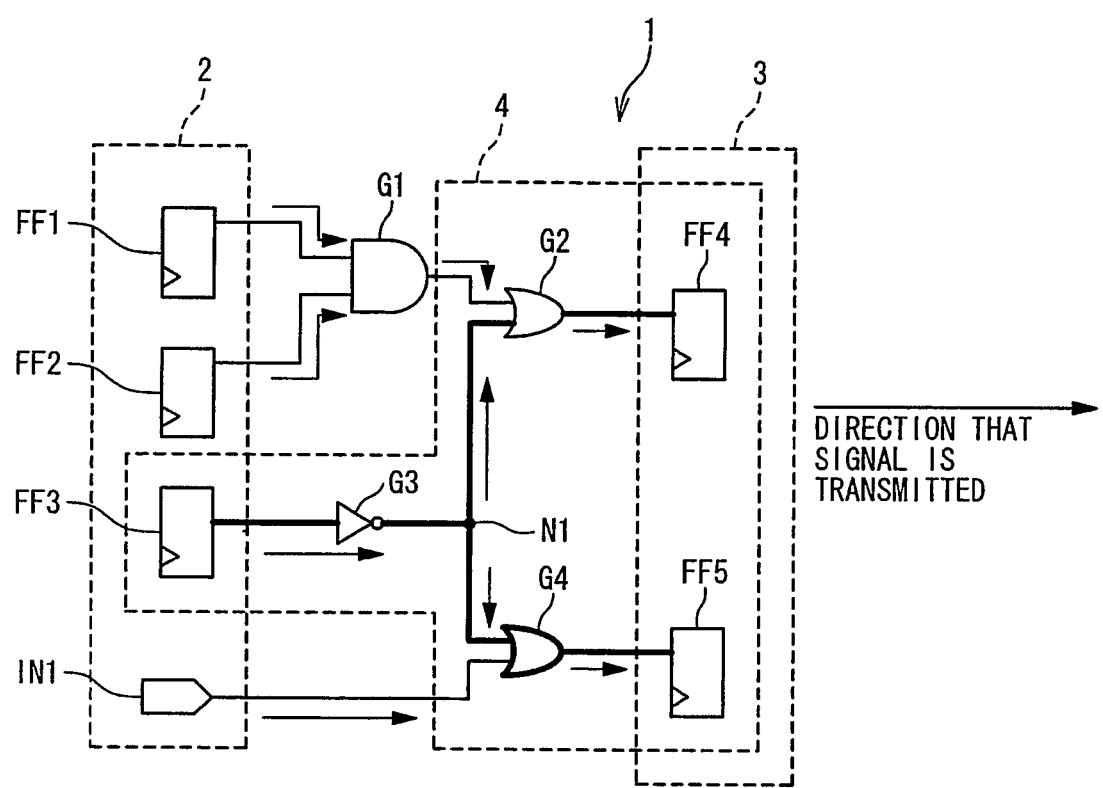
FIGS. 2A and 2B are circuit diagrams showing configurations of logic cones according to the present invention.
Figure 2B:
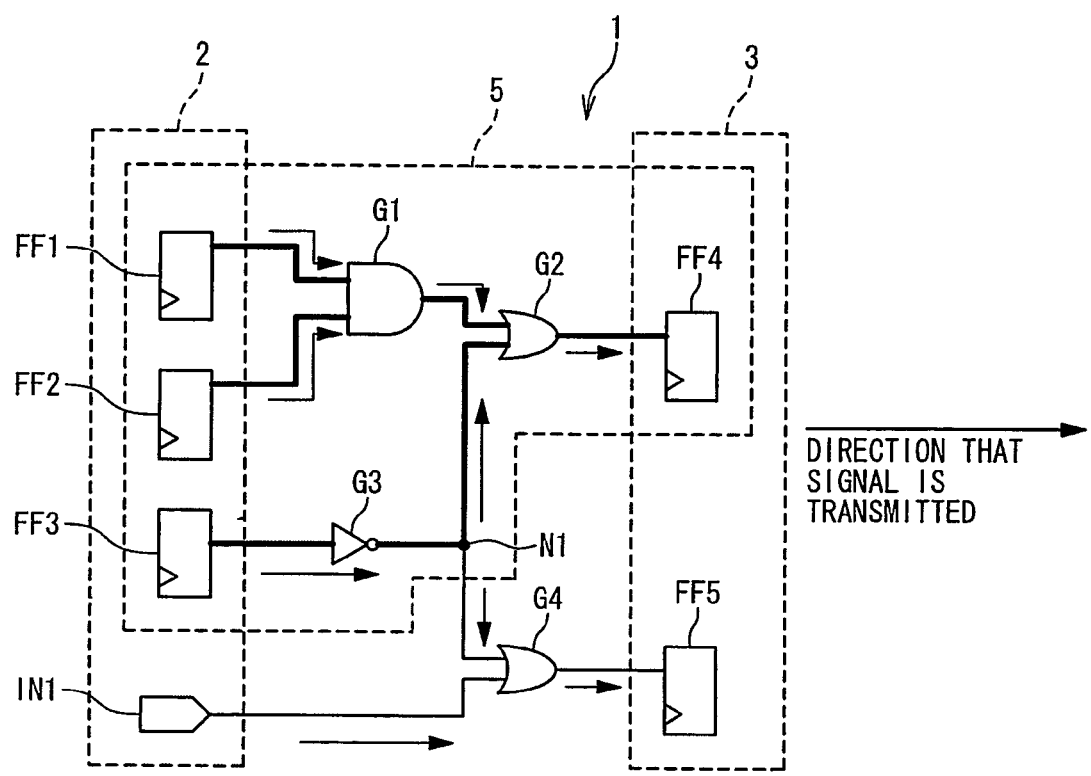

Hereinafter, configurations of logic cones in the present embodiment will be described referring to the drawings. FIG. 2A is a circuit diagram showing a configuration of a forward logic cone according to the present embodiment. FIG. 2B is a circuit diagram showing a configuration of a backward logic cone according to the present embodiment. Each of capacitance estimation target circuits 1 in FIGS. 2A and 2B is a circuit showing one example of a logical circuit targeted for capacity analysis. The capacitance estimation target circuit 1 is configured to include a plurality of flip flops (a first flip flop circuit FF1 to a fifth flip flop circuit FF5) and a plurality of logic gates (a first logic gate G1 to a fourth logic gate G4). In addition, the capacitance estimation target circuit 1 includes an input pin IN1. An input stage 2 of the capacitance estimation target circuit 1 is configured to include the first flip flop circuit FF1, the second flip flop circuit FF2, the third flip flop circuit FF3, and the input pin IN1. An output stage 3 of the capacitance estimation target circuit 1 is configured to include the fourth flip flop circuit FF4 and the fifth flip flop circuit FF5.

In the present embodiment, to specify the forward logic cone 4, the predetermined flip flop included in the input stage 2 or one output pin of a macro is determined. Here, a case of specifying the forward logic cone 4 corresponding to the third flip flop circuit FF3 is shown as an example. In this case, a signal outputted from the third flip flop circuit FF3 is supplied to a node N1 through the third logic gate G3, and further supplied through the node N1 to the second logic gate G2 and the fourth logic gate G4. A signal outputted from the second logic gate G2 is supplied to the fourth flip flop circuit FF4, and a signal outputted from the fourth logic gate G4 is supplied to the fifth flip flop circuit FF5. Therefore, in this case, in correspondence with the third flip flop circuit FF3, a combined circuit composed of the third logic gate G3, the second logic gate G2, and the fourth logic gate G4 is specified as the forward logic cone 4.

Similarly, in the present embodiment, to specify the backward logic cone 5, the predetermined flip flop included in the output stage 3 or one input pin of a macro is determined. Here, a case of specifying the backward logic cone 5 corresponding to the fourth flip flop circuit FF4 is shown as an example. In this case, the circuit is traced through a signal path for supplying a signal to the fourth flip flop circuit FF4, in a backward direction against the direction in which the signal is transmitted. Referring to FIG. 2B, to the fourth flip flop FF4, signals are respectively supplied through the second logic gate G2 from the third logic gate G3 and the first logic gate G1. To the first logic gate G1, signals respectively outputted from the first flip flop circuit FF1 and the second flip flop FF2 are supplied. Therefore, for the fourth flip flop circuit FF4, a combined circuit composed of the first logic gate G1, the third logic gate G3, and the second logic gate G2 is identified as the backward logic cone 5.

When there are a plurality of logic cones, their sizes (the number or area of logic gates composing a combined circuit) are rarely the same. A description of the present embodiment will be given below, showing a case where the size of a logic cone (hereinafter referred to as logic cone size) corresponds to the number of logic gates composing a combined circuit. FIGS. 3A to 3C are circuit diagrams respectively showing circuit configurations of different logic cone sizes. FIG. 3A shows the circuit configuration where the logic cone size is "1". Similarly, FIG. 3B shows the circuit configuration where the logic cone size is "2", and FIG. 3C shows the circuit configuration where the logic cone size is "3". Here, F/O=n (where n is an arbitrary natural number) in FIGS. 3A to 3C denotes the fan-out number of a respective circuit.

Figure 4A:
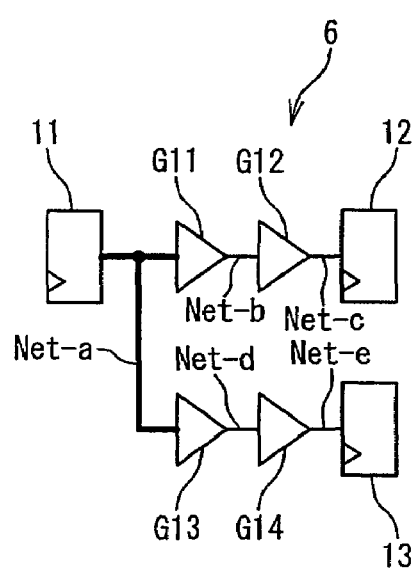
FIGS. 4A and 4B are circuit diagrams showing configurations of two forward logic cones having the same fan-out numbers from output stage but different logic cone sizes according to the present invention.
Figure 4B:
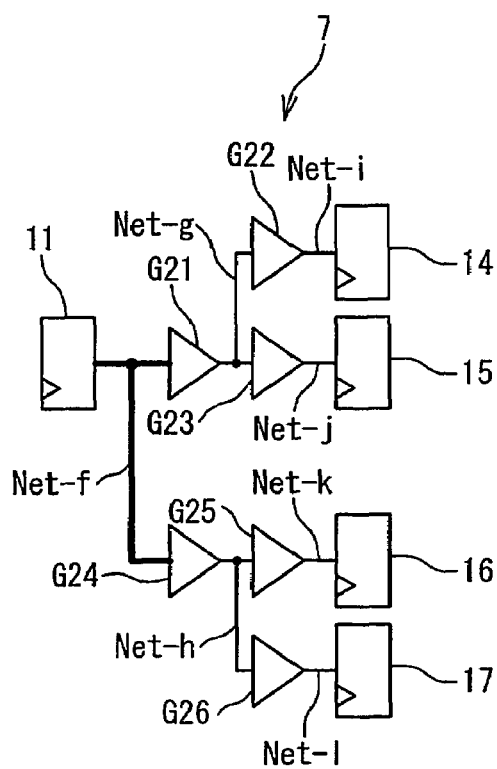

As described above, when there are a plurality of logic cones, their logic cone sizes are rarely the same. In particular, even logic cones have the same fan-out number from the output stage (or fan-in number to the input stage), their logic cone sizes may be different from each other. FIGS. 4A and 4B are circuit diagrams showing the configurations of two forward logic cones having the same fan-out numbers from output stage but different logic cone sizes. The logic cone 6 shown in FIG. 4A shows the configuration of the forward logic cone having logic gates G11 to G14. The logic cone 7 shown in FIG. 4B shows the configuration of the forward logic cone having logic gates G21 to G26.

As shown in FIGS. 4A and 4B, the fan-out number of the flip flop 11 composing input stages of the logic cone 6 is the same as that of the flip flop 11 composing input stages of the logic cone 7. However, comparison between the logic cone size of the logic cone 6 and that of the logic cone 7 indicates that the logic cone size of the logic cone 7 is larger than that of the logic cone 6.

In a case where the logic cone size is small, when logic gates composing this logic cone are placed, the logic gates hardly interfere with one another. Therefore, these logic gates are densely placed. On the other hand, in a case where the logic cone size is relatively large, when logic gates compos-ing this logic cone are placed, the logic gates interfere with one another. Thus, these logic gates are thinly placed in a spreading manner. When the logic gates are densely placed, the interconnection length of the net is short. When the logic gates are thinly placed in a spreading manner, the interconnection length of the net is long.

The tentative interconnection length and the capacitance of the net of a logical circuit are proportional to each other. The interconnect capacitance estimating system of the present embodiment considers the configuration of the logic cone, and thus is capable of analyzing the interconnection length in the logical circuit with high accuracy. Consequently, the capacitance of the net can be analyzed with higher accuracy than that is achieved by a method of analyzing the capacitance of the net conventionally practiced.

Figure 5:
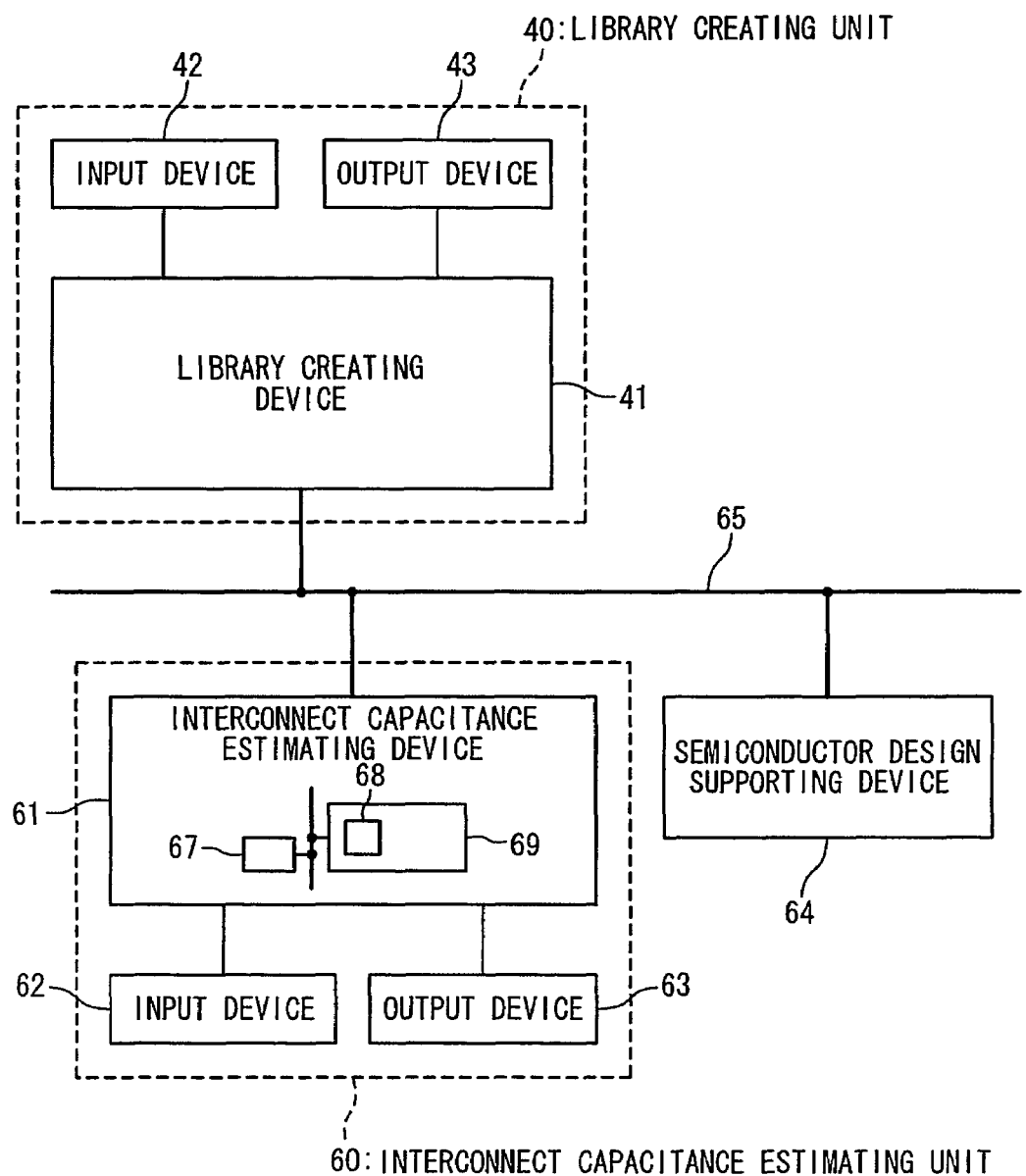
FIG. 5 is a block diagram showing a configuration of an interconnect capacitance estimating system according to the present invention.

Hereinafter, the configuration of the interconnect capacitance estimating system of the present embodiment will be described referring to the drawing. FIG. 5 is a block diagram showing a configuration of the interconnect capacitance estimating system according to the present embodiment. Referring to FIG. 5, the interconnect capacitance estimating system is configured to include a library creating unit 40, an interconnect capacitance estimating unit 60, and a semiconductor design supporting device 64, which are connected to one another via a LAN 65.

The library creating unit 40 is a system which creates and holds a library used for estimation of the interconnect capacitance. As shown in FIG. 5, the library creating unit 40 of the present embodiment is composed of a library creating device 41, an input device 42, and an output device 43.

The library creating device 41 is an information processor which processes inputted information with a computer and then outputs results of this processing. A description of the embodiment will be given below, illustrating a case where the library creating device 41 is composed of a computer including at least one CPU.

The input device 42 is a man-machine interface represented by a keyboard and a mouse. As shown in FIG. 5, the input device 42 is connected to the library creating device 41. The user inputs data and a command into the library creating device 41 via the input device 42. The library creating device 41 creates a library for analyzing the capacitance of a net based on these data and command.

The output device 43 is a man-machine interface represented by a CRT and a liquid crystal display device. As shown in FIG. 5, the output device 43 is connected to the library creating device 41. The library creating device 41 outputs results of information processing performed therein to the output device 43. The user performs operation related to creation of a library for information outputted via the output device 43. The library creating device 41 will be described in detail, later.

The interconnect capacitance estimating unit 60 is a device which analyzes the capacitance of a net based on a library created by the library creating unit 40. As shown in FIG. 5, the interconnect capacitance estimating unit 60 is configured to include an interconnect capacitance estimating device 61, an input device 62, and an output device 63. The interconnect capacitance estimating device 61 is an information processor which analyzes the capacitance of the net based on the logical design data supplied from the semiconductor design supporting device 64. The interconnect capacitance estimating device 61 includes a CPU 67 which executes an interconnect capacitance estimating program 68 stored in a storage device 69. An operation performed by the interconnect capacitance estimating device 61 will be described in detail, later. The input device 62 is a man-machine interface similar to the input device 42. The output device 63 is a man-machine interface similar to the output device 43.

The semiconductor design supporting device 64 is an information processor which holds various tools and design data related to semiconductor design. In the present embodiment, the semiconductor design supporting device 64 holds design data of a semiconductor circuit targeted for manufacture. The semiconductor design supporting device 64 performs logical synthesis on the design data to create the logical design data, in response to a request from the interconnect capacitance estimating unit 60. The interconnect capacitance estimating device 61 executes analysis of the capacitance of the net based on this logical design data. The semiconductor design supporting device 64 may be included in the interconnect capacitance estimating unit 60, especially in the interconnect capacitance estimating device 61.

Figure 6:
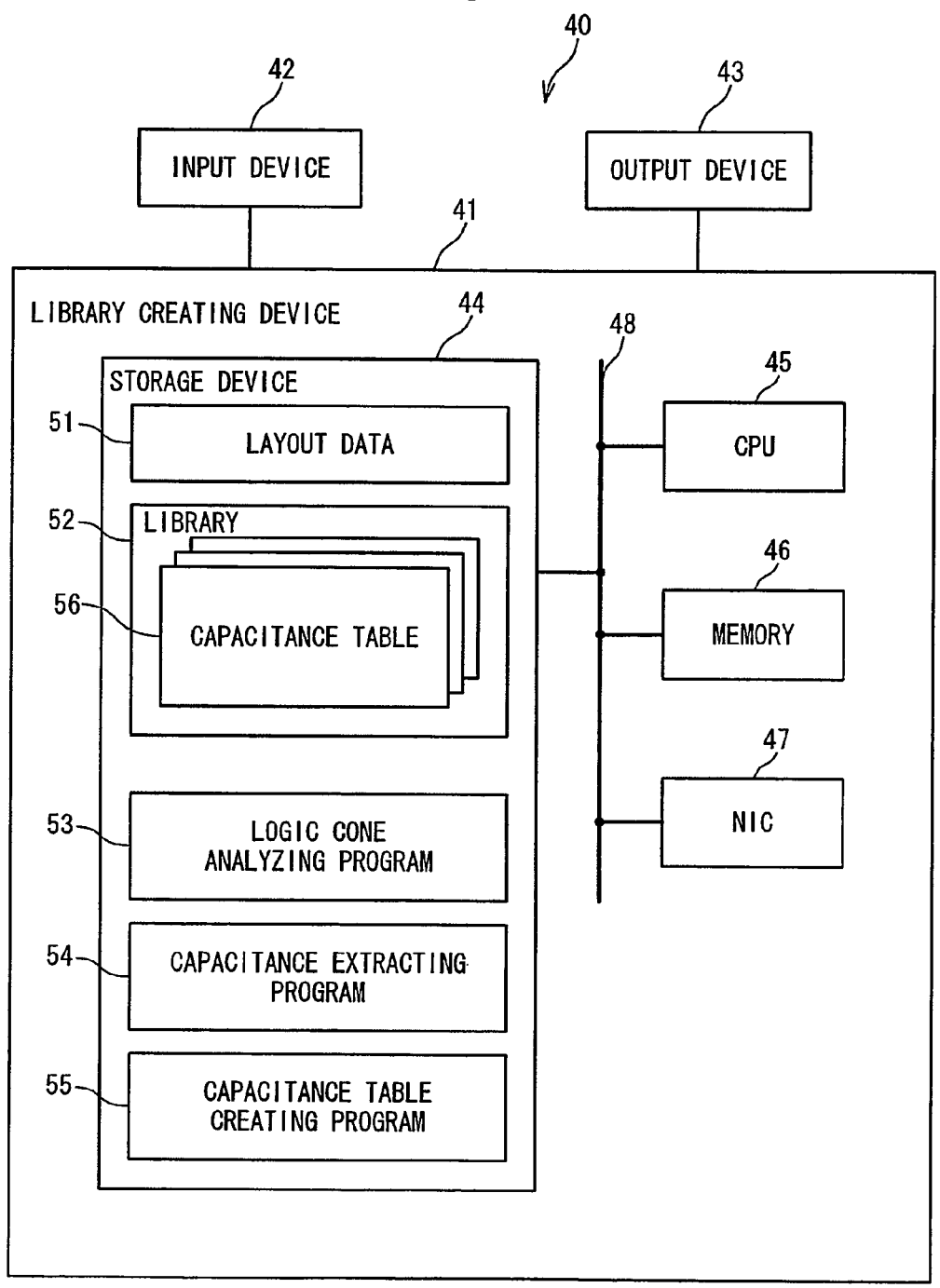
FIG. 6 is a block diagram showing a configuration of a library creating device according to the present invention.

Hereinafter, the configuration of the library creating device 41 in the interconnect capacitance prediction system of the present embodiment will be described referring to the drawing. FIG. 6 is a block diagram showing a configuration of the library creating unit 40 of the present embodiment. As shown in FIG. 6, the library creating device 41 is configured to include a storage device 44, a CPU (Central Processing Unit) 45, a memory 46, and an NIC (Network Interface Card) 47, which are connected to one another via a bus 48.

The storage device 44 is a device for storing data and programs related to creation of a library. In the present embodiment, it is preferable that the storage device 44 be a non-volatile storage device with a large capacity. Therefore, a description of the embodiment is given below, illustrating a case where the storage device 44 is composed of an HDD (Hard Disk Drive).

The CPU (Central Processing Unit) 45 is a processor which executes control of various devices included in the library creating device 41, data processing, and the like. The CPU 45 interprets and calculates a command inputted from the input device 42, data received via the bus 48, and the like, and outputs calculation results to the predetermined device (for example, the output device 43).

The memory 46 is a recording medium used upon executing software. On the memory 46, data reading and writing are executed in response to a command from the CPU 45. It is preferable that the memory 46 in the present embodiment be a device that permits high-speed data reading and writing. Therefore, a description of the embodiment will be given below, illustrating a case where the memory 46 is a semiconductor memory (for example, DDR-SDRAM).

The NIC (Network Interface Card) 47 is a communication interface which can be connected to a network (not shown) configured to include a system having the library creating unit 40. The NIC 47 includes a connector for connecting the library creating device 41 to the network described above (for example, LAN), and receives data and a command supplied via the network. In addition, the library creating device 41 outputs predetermined data to a predetermined device on the network via the NIC 47 network.

As shown in FIG. 6, the storage device 44 is configured to include layout data 51, a library 52, a logic cone analyzing program 53, a capacitance extracting program 54, and a capacitance table creating program 55.

The layout data 51 are data in which placement and routing of logic gate are executed based on connection information obtained by logical design and a logical cell library prepared by circuit design. The layout data 51 is used upon creating a capacitance table 56. The library creating device 41 composes the library 52 including a plurality of capacitance tables 56. It is preferable that the library 52 be so configured as to be capable of providing the capacitance tables 56 in correspondence with various logical design data. Thus, it is preferable that the layout data 51 of the present embodiment be composed of a plurality of layout data such that the layout data 51 can correspond to various logical design data. The layout data 51 may be stored in an external device such as the semiconductor design supporting device 64. In this case, the external device and the library creating device 41 may compose a library creating system.

The library 52 is a file including the capacitance tables 56. As shown in FIG. 6, the library 52 is configured to include the capacitance tables 56. The capacitance table 56 is read by an analyzing device (not shown) when analysis of the capacitance of the net is performed based on the logical design data. The capacitance table 56 includes data used upon analyzing the capacitance of the net, and is so configured as to be able to obtain the capacitance of the net in correspondence with a logic cone of a circuit and the fan-out number of the net.

The logic cone analyzing program 53 is a computer program for analyzing a logic cone of the net based on the layout data 51. The capacitance extracting program 54 is a computer program which calculates the fan-out number of the net and the capacitance of the net based on the layout data 51. The capacitance table creating program 55 is a computer program which creates the capacitance table 56 based on execution results of the logic cone analyzing program 53 and the capacitance extracting program 54, and creates the library 52 in correspondence with the capacitance table 56.

Figure 7:
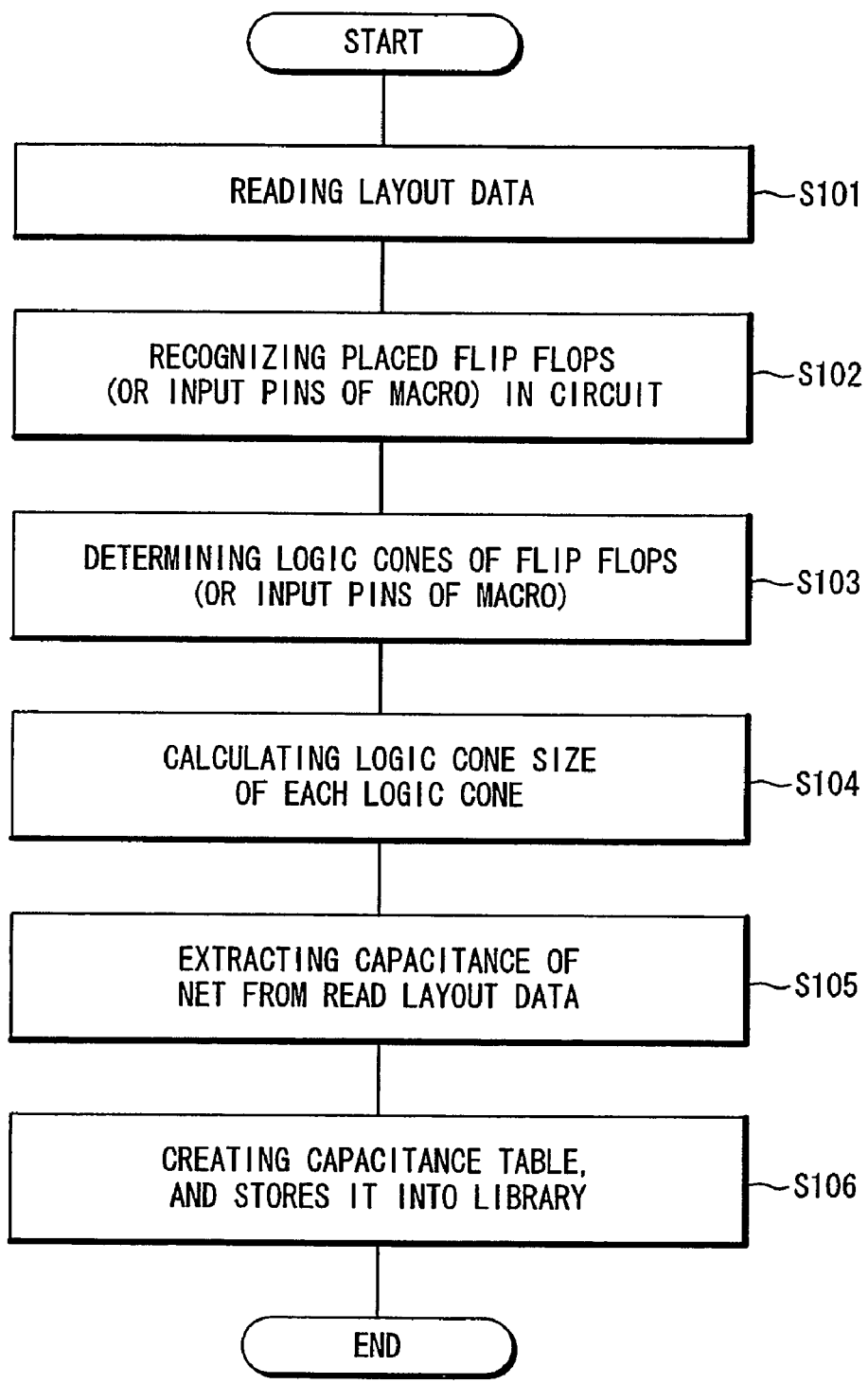
FIG. 7 is a flowchart showing an operation of creating a library according to the present invention.

Hereinafter, operation of the present embodiment will be described referring to the drawings. FIG. 7 is a flowchart showing a library creating operation of the present embodiment. The operation shown in FIG. 7 starts when the CPU 45 executes the capacitance table creating program 55. A description is given below, illustrating a case where the created capacitance table is a table corresponding to the forward logic cone.

In step S101, in the library creating device 41, the capacitance table creating program 55 reads the layout data 51 in the storage device 44. In step S102, based on the read layout data 51, the capacitance table creating program 55 recognizes the placed flip flops (or input/output pins of a macro), and figures out connection conditions of the respective placed flip flops.

In step S103, the capacitance table creating program 55 requests the CPU 45 to execute the logic cone analyzing program 53, and the CPU 45 executes the logic cone analyzing program 53 in response to this request. The logic cone analyzing program 53 determines one predetermined flip flop and specifies it as an input stage. The logic cone analyzing program 53 traces a signal path through which a signal outputted from this flip flop is transmitted, and confirms the signal path up to a flip flop at a later stage where this signal is received. The logic cone analyzing program 53 confirms all the flip flops that receive the signal from the input stage to determine the configuration of the logic cone including an output stage thereof.

In step S104, the logic cone analyzing program 53 calculates the logic cone size based on the determined configuration of the logic cone. In this operation, the logic cone analyzing program 53 calculates the logic cone size based on the number of logic gates (the number of cells) or the area of the logic gates (area of cells). Here, the logic gates compose the logic cone determined in step S103. In this operation, if it is previously defined which one of the number of cells and the area of cells is the basis for the calculation of the logic cone size, the logic cone analyzing program 53 calculates the logic cone size based on this definition.

In step S105, the capacitance table creating program 55 requests the CPU 45 to execute the capacitance extracting program 54, and the CPU 45 executes the capacitance extracting program 54 in response to this request. The capacitance extracting program 54 extracts, for a net included in the logic cone whose configuration has been determined in step S103, the capacitance of a net and the fan-out number based on the layout data 51 read in step S101. A detailed description will be given below, referring to a case of the logic cones shown in FIGS. 4A and 4B. Assume that the layout data 51 has data as shown in FIG. 9 for the logic cones in FIGS. 4A and 4B. In this case, data of the execution results of the capacitance extracting program 54 are as shown in FIG. 10.

In step S106, the capacitance table creating program 55 creates, for the results extracted by the capacitance extracting program 54 in step S105, the capacitance table 56 so that the capacitance of a net corresponding to the logic cone size and the fan-out number can be alternatively drawn, and stores it into the library 52. The capacitance table creating program 55 creates the capacitance tables 56 based on the logic cones corresponding to a plurality of flop flops functioning as input stages, and stores the plurality of the capacitance tables 56 into the library 52. Based on the forward logic cone size and the fan-out number of a net, the tables created in this manner are formed into a library which provides an estimated value of the interconnect capacitance of the net, and then the processing is ended. When there are a plurality of nets having the same logic cone size and the same fan-out number, the capacitance table creating program 55 calculates an average value of the interconnect capacitance of nets, and then creates the capacitance table 56 using the calculated average value. More specifically, the capacitance table is as shown in FIG. 11 based on the data shown in FIG. 10.

In the above case where there are a plurality of nets having the same logic cone size and the same fan-out number, the operation in the present embodiment has been illustrated in which the average value is calculated and the capacitance table 56 is created by using the calculated average value. However, the present invention is not limited to this configuration of the capacitance table 56. Other than the method using the average value, for example, a method using a maximum value or a method of excluding the top 10% of the nets having a large interconnect capacitance and using a maximum value of the interconnect capacitance of the remaining percentage of the nets may be used to create the capacitance table 56.

Figure 8:
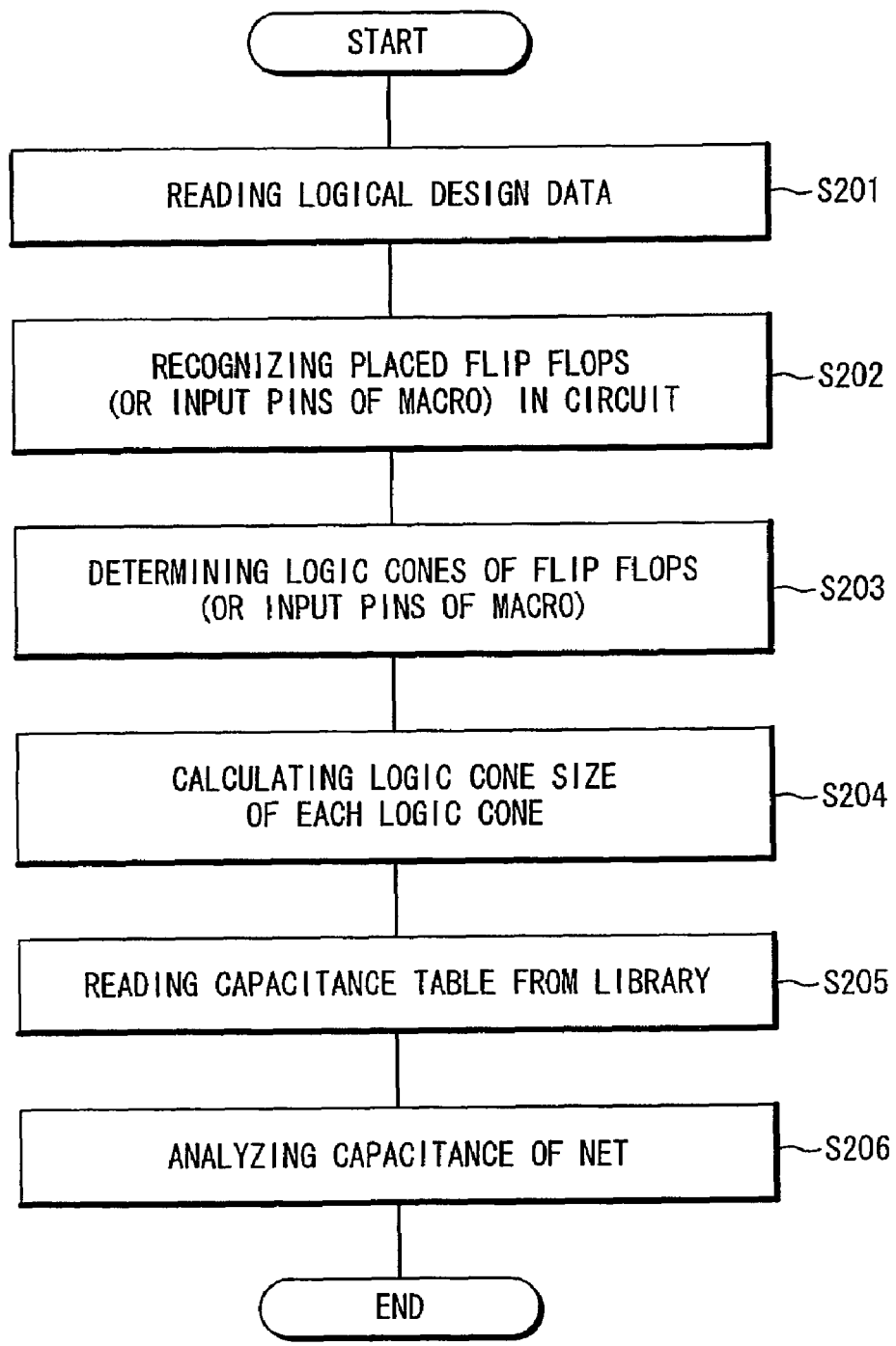
FIG. 8 is a flowchart showing an operation of estimating an interconnect capacitance according to the present invention.

Hereinafter, operation of analyzing the capacitance of a net (estimating the interconnect capacitance) in the present embodiment will be described referring to the drawing. FIG. 8 is a flowchart showing an operation of estimating the interconnect capacitance of the present embodiment. The operation shown in FIG. 8 starts when the CPU 67 executes the interconnect capacitance estimating program 68. In step S201, the interconnect capacitance estimating program 68 reads the logical design data from a storage device (not shown) included in the semiconductor design supporting device 64. The interconnect capacitance estimating program 68 confirms the configuration of a circuit targeted for timing estimation based on read logical design data.

In step S202, based on the read logical design data, the interconnect capacitance estimating program 68 recognizes the placed flip flops (or input/output pins of a macro), and figures out connection conditions of the respective placed flip flops.

In step S203, the interconnect capacitance estimating program 68 determines one predetermined flip flop, and specifies it as an input stage. The interconnect capacitance estimating program 68 traces a signal path through which a signal outputted from this flip flop is transmitted, and confirms the signal path up to a flip flop at a later stage where this signal is received. The interconnect capacitance estimating program 68 confirms all the flip flops that receive the signal from the input stage to determine the configuration of the logic cone including an output stage thereof.

In step S204, the interconnect capacitance estimating program 68 calculates the logic cone size based on the determined configuration of the logic cone. In this operation, the interconnect capacitance estimating program 68 calculates, in correspondence with a previously defined value, the logic cone size based on the number of logic gates (the number of cells) of the logic cone or the area of the logic gates (the area of the cells). Here, the logic cone is determined at step S203. In this operation, if it is previously defined which one of the number of cells and the area of the cells is the basis for the calculation of the logic cone size, the interconnect capacitance estimating program 68 calculates the logic cone size based on this definition. Moreover, the interconnect capacitance estimating program 68 determines a fan-out of each net included in the logic cone in correspondence with the logic cone configuration and the logic cone size.

In step S205, the interconnect capacitance estimating program 68 reads the capacitance table 56 from the library 52 of the library creating device 41. In step S206, the interconnect capacitance estimating program 68 refers to the capacitance table 56 read in step S205, and analyzes the capacitance of the net based on the logic cone size and the fan-out number of the net obtained in step S204. The results of analysis executed by the interconnect capacitance estimating program 68 are outputted to a predetermined output device (for example, output device 63) and the recording medium.

By using the logic cone for the estimation of the interconnection length at the time of logical circuit design in this manner, the interconnection length before layout can be estimated with high accuracy. As described above, the interconnection length of the logical circuit and the capacitance of the net are proportional to each other. The capacitance analysis using the capacitance table of the present invention can analyze the capacitance of the net in the logical circuit with high accuracy by estimating the interconnection length with high accuracy.

It is apparent that the present invention is not limited to the above embodiment, that may be modified and changed without departing from the scope and spirit of the invention.

What is claimed is:

1. An interconnect capacitance estimation system, which estimates interconnect capacitance in a circuit, comprising:
a first storage device configured to store layout data;
a library creating device configured to read said layout data, create a library including a table used for estimating a capacitance of a net in a semiconductor circuit based on said read layout data, and store said library into a second storage device; and
an interconnect capacitance estimating device configured to estimate a capacitance of a target net in a target semiconductor circuit based on design data of said target semiconductor circuit and said table in said library,
wherein said library creating device calculates a logic cone size of a logic cone which is a combined circuit composing a signal path through which a signal passes from an input stage of said net to an output stage of said net, creates said table which relates a capacitance of said net, said logic cone size and a fan-out of said net, and stores said table into said library, and said interconnect capacitance estimating device calculates a logic cone size of a logic cone of said target net based on said design data, and estimates a capacitance of said target net based on said logic cone size of said target net and said table.

2. The interconnect capacitance estimation system according to claim 1, wherein said library creating device specifies one of a plurality of input stage elements included in said input stage as a start point outputting said signal, specifies a combination circuit composing a signal path through which said signal passes from said start point to one of a plurality of output stage elements included in said output stage as a forward logic cone, and specifies said forward logic cone as said logic cone of said target net.

3. The interconnect capacitance estimation system according to claim 2, wherein said plurality of input stage elements includes a plurality of first flip flop circuits, specifies one of said plurality of first flip flop circuits as an input stage flip flop circuit corresponding to said start point, and specifies a second flip flop circuit which is at a next stage of said input stage flip flop circuit as said output stage.

4. The interconnect capacitance estimation system according to claim 1, wherein said library creating device specifies one of a plurality of output stage elements included in said output stage as an end point receiving said signal, specifies a combination circuit composing a signal path through which said signal passes from a plurality of input stage elements included in said input stage to said end point as a backward logic cone, and specifies said backward logic cone as said logic cone of said target net.

5. The interconnect capacitance estimation system according to claim 4, wherein said plurality of output stage elements includes a plurality of second flip flop circuits, said library creating device specifies one of said plurality of second flip flop circuits as an output stage flip flop circuit corresponding to said end point, and specifies a first flip flop circuit which is at a previous stage of said output stage flip flop circuit as said output stage.

6. The interconnect capacitance estimation system according to claim 1, wherein said library creating device create said table which relates a capacitance of said net including said logic cone to said logic cone size and a fan-out of said logic cone.

7. The interconnect capacitance estimation system according to claim 1, wherein said library creating device extracts logic gates included in said logic cone, and determines said logic cone size based on at least one of number and area of said logic gates.

8. A library creating system comprising:
   a first storage device configured to store layout data; and
   a library creating device configured to read said layout data, create a library including a table used for estimating capacitance of a net in a semiconductor circuit based on said read layout data, and stores said library into a second storage device,
   wherein said library creating device calculates a logic cone size of a logic cone which is a combined circuit composing a signal path through which a signal passes from an input stage of said net to an output stage of said net, creates said table which relates a capacitance of said net, said logic cone size and a fan-out of said net, and stores said table into said library.

9. The library creating system according to claim 8, wherein said library creating device specifies one of a plurality of input stage elements included in said input stage as a start point outputting said signal, specifies a combination circuit composing a signal path through which said signal passes from said start point to one of a plurality of output stage elements included in said output stage as a forward logic cone, and specifies said forward logic cone as said logic cone of said target net.

10. The library creating system according to claim 9, wherein said plurality of input stage elements includes a plurality of first flip flop circuits, specifies one of said plurality of first flip flop circuits as an input stage flip flop circuit corresponding to said start point, and specifies a second flip flop circuit which is at a next stage of said input stage flip flop circuit as said output stage.

11. The library creating system according to claim 8, wherein said library creating device create said table which relates a capacitance of said net including said logic cone to said logic cone size and a fan-out of said logic cone.

12. The library creating system according to claim 8, wherein said library creating device extracts logic gates included in said logic cone, and determines said logic cone size based on at least one of number and area of said logic gates.

13. A computer computer-readable medium that has stored therein computer program product that comprises code that, when executed, causes a computer to perform the following:
   (a) reading layout data stored in a first storage device;
   (b) create a net list based on said read layout data;
   (c) determining a logic cone which is a combined circuit composing a signal path through which a signal passes from an input stage of a net to an output stage of said net, based on said net list; and
   (d) calculating a logic cone size of said logic cone to create a library including a table which relates a capacitance of said net, said logic cone size and a fan-out of said net.

14. The computer readable medium according to claim 13, wherein said step (c) includes:
   (c1) specifying one of a plurality of input stage elements included in said input stage as a start point outputting said signal, and
   (c2) specifying a combination circuit composing a signal path through which said signal passes from said start point to one of a plurality of output stage elements included in said output stage as a forward logic cone,
   said step (d) includes:
   (d1) creating said table in which said forward logic cone is as said logic cone of said net.

15. The computer readable medium according to claim 14, wherein said plurality of input stage elements includes a plurality of first flip flop circuits,
   said step (c) further includes:
   (c3) specifying one of said plurality of first flip flop circuits as an input stage flip flop circuit corresponding to said start point, and
   (c4) specifying a second flip flop circuit which is at the next stage of said input stage flip flop circuit as said output stage.

16. The computer readable medium according to claim 13, wherein said step (d) includes:
   (d1) creating said table which relates a capacitance of said net including said logic cone to said logic cone size and a fan-out of said logic cone.

17. The computer readable medium according to claim 13, wherein said step (d) includes:
   (d1) extracting logic gates included in said logic cone, and determining said logic cone size based on at least one of number and area of said logic gates.

* * * * *